United States Patent
Bhuyan et al.

(10) Patent No.: US 11,527,407 B2
(45) Date of Patent: Dec. 13, 2022

(54) VAPOR DEPOSITION OF CARBON-BASED FILMS

(71) Applicants: Applied Materials, Inc., Santa Clara, CA (US); National University of Singapore, Singapore (SG)

(72) Inventors: Bhaskar Jyoti Bhuyan, San Jose, CA (US); Andrea Leoncini, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 431 days.

(21) Appl. No.: 16/807,796

(22) Filed: Mar. 3, 2020

(65) Prior Publication Data

US 2021/0280420 A1   Sep. 9, 2021

(51) Int. Cl.
| | | |
|---|---|---|
| *H01L 21/033* | (2006.01) | |
| *C23C 16/44* | (2006.01) | |
| *C23C 16/04* | (2006.01) | |
| *C23C 16/46* | (2006.01) | |

(52) U.S. Cl.
CPC ........ *H01L 21/0337* (2013.01); *C23C 16/042* (2013.01); *C23C 16/4408* (2013.01); *C23C 16/46* (2013.01); *H01L 21/0332* (2013.01)

(58) Field of Classification Search
CPC ............ H01L 21/0332; H01L 21/0337; C23C 16/042; C23C 16/26; C23C 16/4408; C23C 16/45525; C23C 16/46; C23C 16/50

See application file for complete search history.

(56) References Cited

U.S. PATENT DOCUMENTS

| | | | |
|---|---|---|---|
| 2015/0148459 A1* | 5/2015 | Pawloski | C08K 3/042 427/430.1 |
| 2015/0247258 A1* | 9/2015 | Diankov | H01M 4/925 117/106 |
| 2016/0211142 A1* | 7/2016 | Kim | H01L 21/0332 |
| 2016/0282721 A1* | 9/2016 | Seol | G03F 7/094 |
| 2016/0291472 A1 | 10/2016 | Shin et al. | |

* cited by examiner

*Primary Examiner* — Brook Kebede
(74) *Attorney, Agent, or Firm* — Servilla Whitney LLC

(57) ABSTRACT

Methods of forming graphene hard mask films are disclosed. Some methods are advantageously performed at lower temperatures. The substrate is exposed to an aromatic precursor to form the graphene hard mask film. The substrate comprises one or more of titanium nitride (TiN), tantalum nitride (TaN), silicon (Si), cobalt (Co), titanium (Ti), silicon dioxide ($SiO_2$), copper (Cu), and low-k dielectric materials.

20 Claims, 3 Drawing Sheets

VAPOR DEPOSITION OF CARBON-BASED FILMS

TECHNICAL FIELD

Embodiments of the present disclosure generally relate to methods for depositing or forming graphene. Some embodiments of the disclosure relate to methods for forming graphene hard mask films on a dielectric substrate. Some embodiments relate to methods for improving the substrate surface quality or deposition parameters while depositing graphene.

BACKGROUND

Graphene has been attracting tremendous amounts of attention in semiconductor manufacturing as a result of its outstanding optical and electrical properties. Due to its unique 2D honeycomb-shaped lattice and one atomic layer structure, graphene, a monolayer of carbon atoms arranged in a hexagonal lattice, has extraordinary potential for the future of the electronics industry. Graphene is the thinnest material, with a thickness of one carbon atom, about 3.35 angstrom. Therefore, graphene has the highest specific surface area (SSA) recorded among carbon materials. This high SSA provides the promising attribute that graphene is able to store more energy than other carbonaceous materials. In addition, the delocalized electrons in graphene sheets are able to travel at high speeds with intrinsic mobility of about $2$-$2.5 \times 10^5$ cm$^2$/vs; thereby helping to transport current efficiently. Due to its thin thickness and high electron mobility, graphene can be used as a replacement for traditional metal barrier layers in next generation semiconductor devices because the resistance of metal lines gets higher and higher as their thickness and dimensions continue to shrink. Graphene also demonstrates high optical transparency, which can be used in flexible electronics, for example in smart watch applications.

Traditional graphene CVD growth requires high temperature (>1000 C) and metal foils as catalysts. At this high temperature, most materials used in the electronic applications could be damaged. In addition, the metal foils need to be removed after graphene growth. The transfer process is costly, and could damage graphene hard mask films and cause metal contamination as well. For this reason, low temperature growth without using metal catalysts is highly desirable.

Currently, chemical vapor deposition (CVD) with metal catalysts is used to grow graphene films. Although high quality graphene films can be deposited by CVD growth, it requires high growth temperature, typically 800-1000° C. or more. This is not compatible with current integration flows in the semiconductor industry because the metal lines and low k films on device wafers cannot tolerate such high temperatures. In addition, graphene deposited by high temperature CVD also needs to be transferred from the metal foils. The transfer process is costly and can lead to damage of the film, defects in the film, and metal contamination. Therefore high temperature CVD by known methods is neither convenient nor feasible for industrial applications. So, direct growth on arbitrary substrates without the use of metal catalysts at relatively lower temperatures is highly desirable.

Accordingly, there is a need for improved methods of depositing graphene hard mask films.

SUMMARY

One or more embodiments of the disclosure are directed to a method of forming a graphene hard mask film. The method comprises: exposing a substrate to an aromatic precursor in a processing chamber; purging the processing chamber of the aromatic precursor; heating the substrate to a temperature less than 600° C. to polymerize the aromatic precursor and deposit a graphene hard mask film on the substrate; and purging the processing chamber.

Additional embodiments of the disclosure are directed to methods of forming a film. In one or more embodiments, the method comprises: forming a flowable graphene hard mask film on a substrate by exposing the substrate to an aromatic precursor; and exposing the substrate to a plasma.

Further embodiments of the disclosure are directed to a non-transitory computer readable medium including instructions, that, when executed by a controller of a processing chamber, causes the processing chamber to perform operations of: expose a substrate to an aromatic precursor in a processing chamber; purge the processing chamber of the aromatic precursor; heat the substrate to a temperature less than 600° C. to polymerize the aromatic precursor and deposit a graphene hard mask film on the substrate; and purge the processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
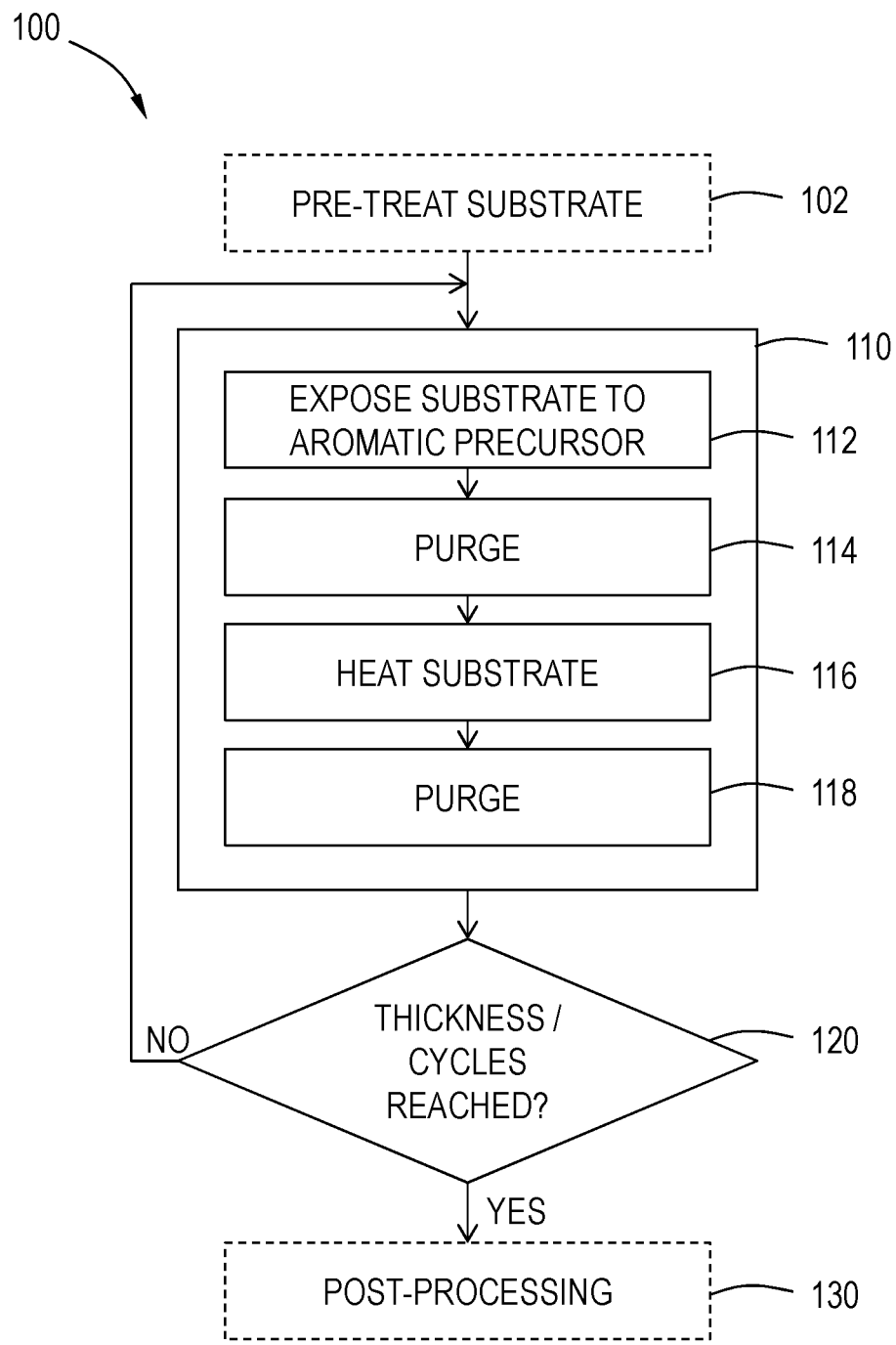
FIG. 1 illustrates a process flow diagram of a method according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a layer or partial layer has been deposited onto a substrate surface, the exposed surface of the newly deposited layer may also be described as the substrate surface.

The method of one or more embodiments is a back end of the line (BEOL) integration scheme. In one or more embodiments, the substrate comprises one or more of titanium nitride (TiN), tantalum nitride (TaN), silicon (Si), cobalt (Co), titanium (Ti), silicon dioxide ($SiO_2$), copper (Cu), and low-k dielectric materials, e.g. Black Diamond®. As used herein, the term "Black Diamond®" refers to a low-k dielectric film produced by Applied Materials®. As used herein, the term "low-k dielectric" refers to a material with a small relative dielectric constant (k) relative to silicon dioxide ($SiO_2$). In one or more embodiments, the low-k dielectric can be any acceptable material known to the skilled artisan. In one or more embodiments, the low-k dielectric is Black Diamond®.

Embodiments of the present disclosure relate to methods for forming graphene hard mask films. Further embodiments of the disclosure relate to methods for improving graphene deposition processes. Some embodiments of the disclosure advantageously provide methods for forming graphene hard mask films at lower temperatures. Some embodiments of the disclosure advantageously provide methods for forming graphene hard mask films of a predetermined thickness at a lower temperature. Some embodiments of the disclosure advantageously provide methods for forming graphene hard mask films with lower resistance.

According to one or more embodiments, the method uses a chemical vapor deposition (CVD) process. As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

According to one or more embodiments, the method uses a chemical vapor deposition (CVD) and an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. aromatic precursor) is pulsed into the reaction zone followed by a first time delay. Next, a second precursor or compound B (e.g. oxidant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

According to one or more embodiments, graphene can be grown by chemical vapor deposition and/or atomic layer deposition for many applications. One or more embodiments of the disclosure advantageously provide processes for chemical vapor deposition to form graphene hard mask films. As used in this specification and the appended claims, the term "graphene hard mask film" refers to a film that comprises graphene. Graphene is an allotrope of carbon in the form of a single layer of atoms in a two-dimensional hexagonal lattice in which one atom forms each vertex. It can be considered as an indefinitely large aromatic molecule, the ultimate case of the family of flat polycyclic aromatic hydrocarbons.

FIG. 1 illustrates a process flow diagram of a method in accordance with one or more embodiments. The method illustrated in FIG. 1 is representative of a chemical vapor deposition (CVD) process, in which the reactive gases are mixed in the processing chamber to allow gas phase reactions of the reactive gases and deposition of the thin film. In some embodiments, the method illustrated in FIG. 1 is representative of an atomic layer deposition (ALD) process, in which the substrate or substrate surface is exposed sequentially to the reactive gases in a manner that prevents or minimizes gas phase reactions of the reactive gases.

FIG. 1 depicts a flow diagram of a method 100 of depositing a film in accordance with one or more embodiments of the present disclosure. With reference to FIG. 1, the method 100 comprises a deposition cycle 110. The method 100 begins at operation 102 by preparing the substrate to be processed. In some embodiments, the method comprises a chemical vapor deposition (CVD) process in which reactive gases are mixed in a processing chamber to allow gas phase reactions of the reactive gases and deposition of a hard mask film on a substrate. In a CVD reaction, the substrate (or substrate surface) can be exposed to a gaseous mixture of a precursor and reactant to deposit a graphene hard mask film having a predetermined thickness. In the CVD reaction, the graphene hard mask film can be deposited in one exposure to the mixed reactive gas, or can be multiple exposures to the mixed reactive gas with purges between. In some embodiments, the method 100 is representative of an atomic layer deposition (ALD) process, in which the substrate or substrate surface is exposed sequentially to the reactive gases in a manner that prevents or minimizes gas phase reactions of the reactive gases.

In some embodiments, preparing the substrate 102 includes a pre-treatment operation. The pre-treatment can be any suitable pre-treatment known to the skilled artisan. Suitable pre-treatments include, but are not limited to, pre-heating, cleaning, soaking, native oxide removal, or deposition of an adhesion layer (e.g. titanium nitride (TiN), tantalum nitride (TaN), and the like).

In one or more embodiments, the substrate is washed. Washing may be performed by any suitable technique known to the skilled artisan including, but not limited to, isopropyl alcohol (IPA) wash, standard cleans known to the skilled artisan including standard clean 1 (SC1) and standard clean 2 (SC2), vapor phase cleaning such as automated process control (APC) cleans, e-APC cleans, and the like. After the substrate is washed, it is loaded into the processing chamber.

At deposition 110, a process is performed to deposit a graphene hard mask film on the substrate (or substrate surface). The deposition process can include one or more operations to form a hard mask on the substrate. In operation 112, the substrate (or substrate surface) is exposed to an aromatic precursor to deposit a graphene hard mask film on the substrate (or substrate surface).

At deposition 110, a process cycle may be performed to deposit a graphene hard mask film on the substrate (or substrate surface). The deposition process can include one or more operations to form a hard mask film on the substrate. In operation 112, the substrate (or substrate surface) is exposed to an aromatic precursor to deposit a graphene hard mask film on the substrate (or substrate surface). The aromatic precursor can be any suitable aromatic compound that can react with (i.e., adsorb or chemisorb onto) the substrate surface to leave an aromatic species on the substrate surface.

At operation 112, the substrate is then loaded into a processing chamber along with one or more precursor, and the substrate is exposed to the precursor. In some embodiments, the precursor comprises an aromatic precursor. The aromatic precursor comprises at least one aromatic ring.

As used herein, in one or more embodiments, the term "aromatic precursor" refers to precursors that are aromatic. As recognized by one of skill in the art, aromaticity is a property of cyclic (ring-shaped), planar (flat) structures with a ring of resonance bonds that gives increased stability compared to other geometric or connective arrangements with the same set of atoms. Aromatic molecules are very stable, and do not break apart easily to react with other substances. Aromaticity describes a conjugated system often made of alternating single and double bonds in a ring. This configuration allows for the electrons in the molecule's pi system to be delocalized around the ring, increasing the molecule's stability.

In one or more embodiments, the aromatic precursor can comprise any aromatic precursor known to the skilled artisan. In some embodiments, the aromatic precursor comprises one or more of benzene, substituted benzene, naphthalene, substituted naphthalene, anthracene, and substituted anthracene. In one or more embodiments, the aromatic precursor may be substituted with one or more alkyl group, one or more alkoxy group, one or more vinyl group, one or more silane group, one or more amine group, one or more halide.

Unless otherwise indicated, the term "lower alkyl," "alkyl," or "alk" as used herein alone or as part of another group includes both straight and branched chain hydrocarbons, containing 1 to 20 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents.

As used herein, the term "alkoxy" includes any of the above alkyl groups linked to an oxygen atom.

As used herein, the terms "vinyl" or "vinyl-containing" refer to groups containing the vinyl group (—CH=CH$_2$).

As used herein, the term "amine" relates to any organic compound containing at least one basic nitrogen atom, e.g. NR'$_2$, wherein R' is independently selected from hydrogen (H) or alkyl.

As used herein, the term "silane" refers to a compound SiR'$_3$, wherein R' is independently selected from hydrogen (H) or alkyl.

As used herein, the term "halide" refers to a binary phase, of which one part is a halogen atom and the other part is an element or radical that is less electronegative than the halogen, to make a fluoride, chloride, bromide, iodide, or astatide compound. A halide ion is a halogen atom bearing a negative charge. As known to those of skill in the art, a halide anion includes fluoride (F—), chloride (Cl—), bromide (Br—), iodide (I—), and astatide (At—).

In one or more embodiments, the aromatic precursors comprise small aromatic molecules with temperature sensitive functional groups. In one or more specific embodiments, the aromatic precursor is selected from one or more of naphthalene, 2,6-dibromonaphthalene, trimethyl 1,3,5-benzentricarboxylate, 9,10-dibromoanthracene, benzoic acid, 2,6-ditertbutylnaphthalene, 1,3,5-trimethoxybenzene, and hexabromobenzene.

The substrate may be any substrate known to one of skill in the art. In one or more embodiments, the substrate comprises on or more of titanium nitride (TiN), tantalum nitride (TaN), silicon (Si), cobalt (Co), titanium (Ti), silicon dioxide ($SiO_2$), copper (Cu), and low-k dielectric materials, e.g. Black Diamond®.

At operation 114, the processing chamber is purged. Purging (i.e. creating a vacuum) can be accomplished with any suitable gas that is not reactive with the substrate, film on the substrate, and/or processing chamber walls. Suitable purge gases include, but are not limited to, $N_2$, He, and Ar. The purge gas may be used to purge the processing chamber of the aromatic precursor, and/or the oxidant. In some embodiments, the same purge gas is used for each purging operation. In other embodiments, a different purge gas is used for the various purging operations. In one or more embodiments, the purge pressure is in a range of from 0.1 mTorr to about 100 Torr, including a range of from about 0.5 mTorr to about 50 Torr, and a range of from about 1 mTorr to about 100 Torr.

At operation 114, the processing chamber is purged to remove unreacted aromatic precursor, reaction products and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the tellurium precursor by any suitable technique including, but not limited to, moving the substrate through a gas curtain to a portion or sector of the processing chamber that contains none or substantially none of the aromatic precursor. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur.

At operation 116, the substrate (or substrate surface) is heated to a temperature in a range of from about 150° C. to about 700° C. In one or more embodiments, the chamber temperature is less than about 500° C. In other embodiments, the deposition process is carried out at temperatures ranging from about 0° C. to about 500° C., including about 25° C., about 50° C., about 75° C., about 100° C., about 125° C., about 150° C., about 175° C., about 200° C., about 425° C., about 250° C., about 275° C., about 300° C., about 325° C., about 350° C., about 375° C., about 400° C., about 425° C., about 450° C., about 475° C., and about 500° C.

In one or more embodiments, the functional groups of the aromatic precursor decompose and activate molecules towards 2D polymerization to form a graphene hard mask film on the substrate. In other embodiments, a reactant may be introduced to the processing chamber at operation 116. The reactant can react with the aromatic-containing species on the substrate surface to form the graphene hard mask film. In some embodiments, the reactant comprises a reducing agent. In one or more embodiments, the reducing agent can comprise any reducing agent known of to one of skill in the art. In other embodiments, the reactant comprises an oxidizing agent. In one or more embodiments, the oxidizing agent can comprise any oxidizing agent known to one of skill in the art. In further embodiments, the reactant comprises one or more of an oxidizing agent and a reducing agent.

At operation 116, the temperature of the substrate in the processing chamber is brought to a temperature in a range of from about 150° C. to about 700° C., including a temperature of about 150° C., about 200° C., about 250° C., about 300° C., about 350° C., about 400° C., about 450° C., about 500° C., about 550° C., about 600° C., about 650° C., and about 700° C. In one or more embodiments, a hard mask film is deposited on the substrate. During deposition, the functional groups on the aromatic precursor decompose and activate the molecules toward 2D polymerization, forming the graphene hard mask film on the substrate.

At operation 118, the processing chamber is cooled and purged, and the substrate can be removed from the processing chamber. Purging (i.e. creating a vacuum) can be accomplished with any suitable gas that is not reactive with the substrate, film on the substrate, and/or processing chamber walls. Suitable purge gases include, but are not limited to, $N_2$, He, and Ar. The purge gas may be used to purge the processing chamber of the aromatic precursor, and/or the oxidant. In some embodiments, the same purge gas is used for each purging operation. In other embodiments, a different purge gas is used for the various purging operations.

At operation 118, the processing chamber is purged. Purging the processing chamber in operation 118 can be the same process or different process than the purge in operation 114. Purging the processing chamber, portion of the processing chamber, area adjacent the substrate surface, etc., removes unreacted reactant, reaction products and by-products from the area adjacent the substrate surface.

The deposition cycle 110 may be performed until a predetermined thickness of graphene has been formed. At operation 120, the thickness of the formed graphene hard mask film is evaluated to determine if it has reached the predetermined thickness. If not, the method 100 returns to operation 112 for further formation. If so, the method 100 moves to optional post processing steps at operation 130, or the method 100 ends.

At decision 120, the thickness of the deposited graphene hard mask film, or number of cycles of aromatic precursor is considered. If the deposited hard mask film has reached a predetermined thickness or a predetermined number of process cycles have been performed, the method 100 moves to an optional post-processing operation 130. If the thickness of the deposited hard mask film or the number of process cycles has not reached the predetermined threshold, the method 100 returns to operation 110 to expose the substrate surface to the aromatic precursor again in operation 112, and continuing.

The optional post-processing operation 130 can be, for example, a process to modify film properties (e.g., annealing) or a further film deposition process (e.g., additional ALD or CVD processes) to grow additional films. In some embodiments, the optional post-processing operation 130 can be a process that modifies a property of the deposited hard mask film. In some embodiments, the optional post-processing operation 130 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited hard mask film increases the density, decreases the resistivity and/or increases the purity of the film.

The method 100 can be performed at any suitable temperature depending on, for example, the aromatic precursor, reactant or thermal budget of the device. In some embodiments, exposures to the aromatic precursor (operation 112) and the reactant (operation 116) occur at the same temperature. In some embodiments, the substrate is maintained at a temperature in a range of from about 150° C. to about 700° C., or in a range of from about 150° C. to about 650° C., or in a range of from about 150° C. to about 500° C. The temperature of the substrate surface may be controlled during formation of the graphene hard mask film. In some embodiments, the substrate surface is maintained at a temperature of less than or equal to about 700° C., less than or equal to about 650° C., less than or equal to about 600° C., less than or equal to about 500° C., less than or equal to about 400° C., less than or equal to about 300° C., less than or equal to about 200° C., less than or equal to about 100° C., less than or equal to about 50° C., or less than or equal to about 25° C.

Typically, CVD processes for forming graphene hard mask films are performed at temperatures in excess of 1000° C. One or more embodiments provides methods for depositing graphene hard mask films at a lower temperature, temperatures less than about 700° C., or less than about 600° C., or less than about 500° C., or less than about 400° C. Without intending to be bound by theory, it is believed that these lower temperatures are more compatible with the thermal budget of electronic devices during manufacture.

In some embodiments, the graphene hard mask film formed by the disclosed method comprises less than or equal to about 1, less than or equal to about 2, less than or equal to about 5, less than or equal to about 10, less than or equal to about 20, gr less than or equal to about 25, or less than or equal to about 30 monolayers of graphene. In some embodiments, the graphene hard mask film formed by the disclosed method comprises in the range of about 0.5 to about 25 monolayers, or in the range of about 0.5 to about 10 monolayers, or in the range of about 1 to about 5 monolayers, or in the range of about 5 to about 10 monolayers of graphene. In some embodiments, the graphene hard mask film formed by the disclosed method has a thickness of less than or equal to about 3 Å, less than or equal to about 5 Å, less than or equal to about 10 Å, less than or equal to about 15 Å, less than or equal to about 20 Å, less than or equal to about 25 Å, less than or equal to about 30 Å, less than or equal to about 40 Å, or less than or equal to about 50 Å.

In some embodiments, the method 100 is capable of being performed in a relatively short time period. In some embodiments, the graphene hard mask film is formed in a period of less than or equal to about 15 minutes, less than or equal to about 10 minutes, less than or equal to about 5 minutes, less than or equal to about 2 minutes, or less than or equal to about 1 minute. In other embodiments, the graphene hard mask film is formed in a period of time in a range of from about 1 hour to about 48 hours.

In some embodiments, the improved substrate surface quality is increased smoothness. In some embodiments, the improved substrate surface quality is decreased hydrogen concentration. In some embodiments, the improved substrate surface quality is decreased contamination.

In some embodiments, the improved deposition parameter is increased film thickness. In some embodiments, the improved deposition parameter is decreased film resistance. In some embodiments, the improved deposition parameter is increased uniformity. These improvements are relative to a graphene hard mask film deposited by similar process parameters (e.g., reactants, temperature, plasma power, deposition time).

Figure 2:
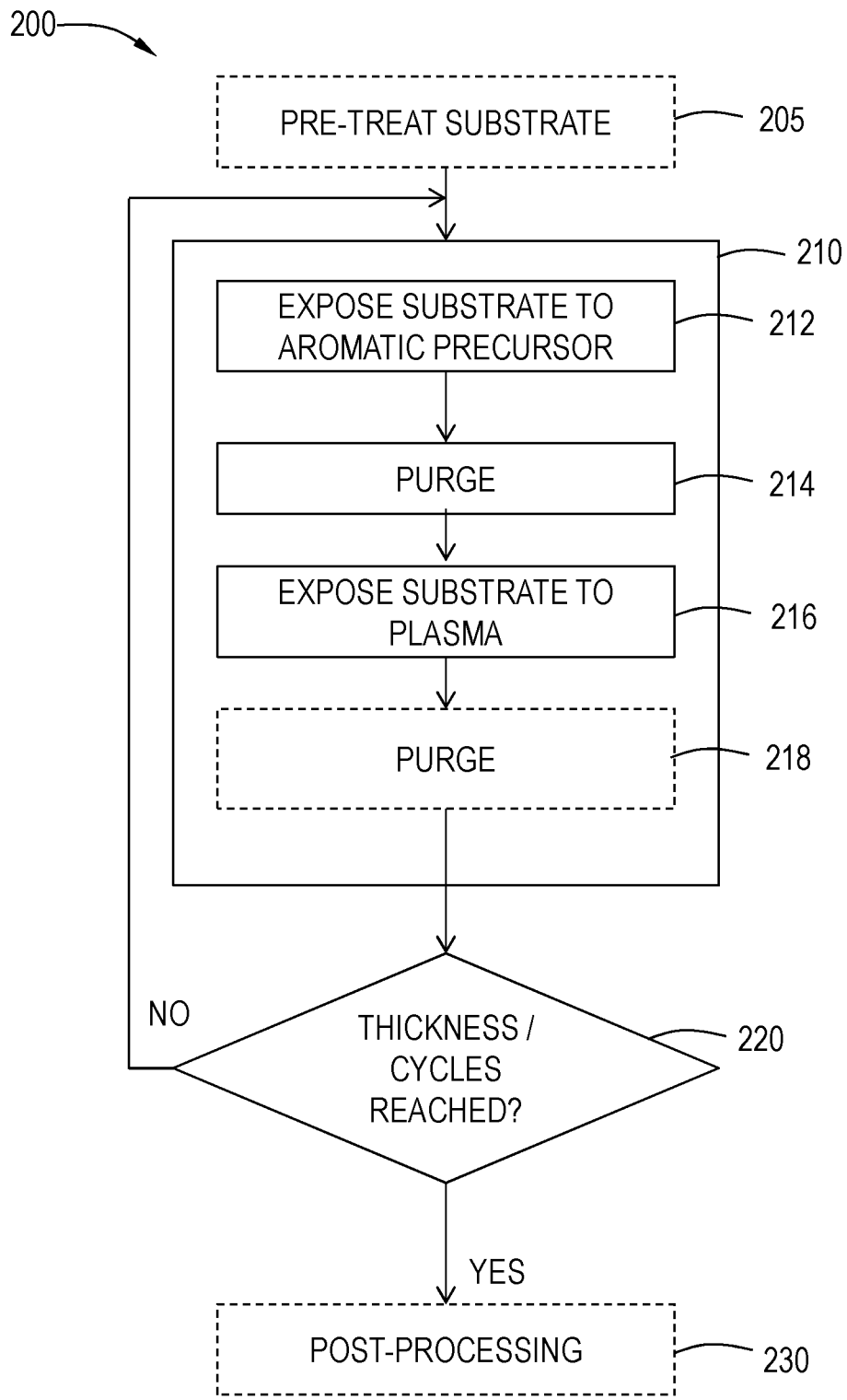
FIG. 2 illustrates a process flow diagram of a method according one or more embodiments of the disclosure.

With reference to FIG. 2, one or more embodiments of the disclosure are directed to a method 200 of depositing a graphene hard mask film. The method illustrated in FIG. 2 is representative of plasma-enhanced process in which the reactive gases are mixed in the processing chamber to allow gas phase reactions of the reactive gases and deposition of the thin film.

In some embodiments, the method 200 includes a pre-treatment operation 205. The pre-treatment can be any suitable pre-treatment known to the skilled artisan. Suitable pre-treatments include, but are not limited to, pre-heating, cleaning, soaking, native oxide removal, or deposition of a layer (e.g. titanium nitride (TiN)).

At deposition operation 210, a process is performed to deposit a graphene hard mask film on the substrate (or substrate surface). The deposition process can include one or more operations to form a graphene hard mask film on the substrate. In operation 212, the substrate (or substrate surface) is exposed to an aromatic precursor to deposit a film on the substrate (or substrate surface).

In one or more embodiments, the aromatic precursor can comprise any aromatic precursor known to the skilled artisan. In some embodiments, the aromatic precursor comprises one or more of benzene, substituted benzene, naphthalene, substituted naphthalene, anthracene, and substituted anthracene. In one or more embodiments, the aromatic precursor may be substituted with one or more alkyl group, one or more alkoxy group, one or more vinyl group, one or more silane group, one or more amine group, one or more halide.

In one or more embodiments, the aromatic precursors comprise small aromatic molecules with temperature sensitive functional groups. In one or more specific embodiments, the aromatic precursor is selected from one or more of naphthalene, 2,6-dibromonaphthalene, trimethyl 1,3,5-benzentricarboxylate, 9,10-dibromoanthracene, benzoic acid, 2,6-ditertbutylnaphthalene, 1,3,5-trimethoxybenzene, and hexabromobenzene.

The substrate may be any substrate known to one of skill in the art. In one or more embodiments, the substrate comprises on or more of titanium nitride (TiN), silicon (Si), cobalt (Co), titanium (Ti), silicon dioxide ($SiO_2$), copper (Cu), and low-k dielectric materials, e.g. Black Diamond®.

At operation 214, the processing chamber is purged to remove unreacted precursor, reaction products, and by-products.

In one or more embodiments, the deposition process comprises a remote plasma enhanced chemical vapor deposition process (PECVD). After forming graphene hard mask film on the substrate, the substrate is exposed to a plasma at operation 216. In one or more embodiments, exposing the graphene hard mask film to a plasma in the processing chamber improves film properties. For example, in one or more embodiments, the wet etch rate is improved, indicating that the density of the graphene hard mask film has been enhanced by plasma treatment. In one or more embodiments, the plasma comprises one or more of nitrogen ($N_2$), argon (Ar), helium (He), hydrogen ($H_2$), carbon monoxide (CO), or carbon dioxide ($CO_2$). In some embodiments, the plasma is a remote plasma. In other embodiments, the plasma is a direct plasma.

In one or more embodiments, the plasma may be generated remotely or within the processing chamber. In one or more embodiments, the plasma is an inductively coupled plasma (ICP) or a conductively coupled plasma (CCP). Any suitable power can be used depending on, for example, the reactants, or the other process conditions. In some embodiments, the plasma is generated with a plasma power in the range of about 10 W to about 3000 W. In some embodiments, the plasma is generated with a plasma power less than or equal to about 3000 W, less than or equal to about 2000 W, less than or equal to about 1000 W, less than or equal to about 500 W, or less than or equal to about 250 W.

At operation 218, the processing chamber is optionally purged after exposure to the plasma. Purging the processing chamber in operation 218 can be the same process or different process than the purge in operation 214. Purging the processing chamber, portion of the processing chamber, area adjacent the substrate surface, etc., removes plasma, reaction products and by-products from the area adjacent the substrate surface.

At decision point 220, in one or more embodiments, the thickness of the deposited film, or number of cycles of precursor and reactant is considered. In one or more embodiments, if the deposited film has reached a predetermined thickness or a predetermined number of process cycles have been performed, the method 200 moves to a post-processing operation 230. In one or more embodiments, if the thickness of the deposited film or the number of process cycles has not reached the predetermined threshold, the method 200 returns to deposition operation 210 to expose the substrate surface to the aromatic precursor again in operation 212, and continuing.

In one or more embodiments, the optional post-processing operation 230 comprises, for example, a process to modify film properties (e.g., annealing) or a further film deposition process (e.g., additional ALD or CVD processes) to grow additional films. In some embodiments, the post-processing operation 230 is process that modifies a property of the deposited film. In some embodiments, the post-processing operation 230 comprises annealing the as-deposited film. In some embodiments, annealing is performed at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. In one or more embodiments, annealing is performed for any suitable length of time. In some embodiments, the graphene hard mask film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film.

In one or more embodiments, the method 200 can be performed at any suitable temperature depending on, for example, the precursor, reactant or thermal budget of the device. In some embodiments, the substrate is maintained at a temperature in a range of about 0° C. to about 500° C.

In one or more embodiments, the substrate (or substrate surface) is exposed to the precursor in a PE-CVD reaction. In a PE-CVD reaction, the substrate (or substrate surface) is exposed to a gaseous mixture of the precursor and, optionally, a reactant to deposit a graphene hard mask film having a predetermined thickness. In the PE-CVD reaction, a graphene hard mask film can be deposited in one exposure to the mixed reactive gas, or can be multiple exposures to the mixed reactive gas with purges between.

In one or more embodiments, the deposition process is carried out in a process volume at pressures ranging from 0.1 mTorr to 100 Torr, including a pressure of about 0.1 mTorr, about 10 mTorr, about 100 mTorr, about 1000 mTorr, about 5000 mTorr, about 1 Torr, about 20 Torr, about 30 Torr, about 40 Torr, about 50 Torr, about 60 Torr, about 70 Torr, about 80 Torr, about 90 Torr, and about 100 Torr.

The precursor-containing gas mixture may further include one or more of a dilution gas selected from helium (He), argon (Ar), xenon (Xe), nitrogen ($N_2$), or hydrogen ($H_2$). The dilution gas of some embodiments comprises a compound that is inert gas relative to the reactants and substrate materials.

The plasma (e.g., capacitive-coupled plasma) may be formed from either top and bottom electrodes or side electrodes. The electrodes may be formed from a single powered electrode, dual powered electrodes, or more electrodes with multiple frequencies such as, but not limited to, 350 KHz, 2 MHz, 13.56 MHz, 27 MHz, 40 MHz, 60 MHz and 100 MHz, being used alternatively or simultaneously in a CVD system with any or all of the reactant gases listed herein to deposit a thin film of dielectric. In some embodiments, the plasma is a capacitively coupled plasma (CCP). In some embodiments, the plasma is an inductively coupled plasma (ICP). In some embodiments, the plasma is a microwave plasma.

In one or more embodiments, the deposition operation 210 can be repeated to form a graphene hard mask film having a predetermined thickness. In some embodiments, the deposition operation 210 is repeated to provide a graphene hard mask film having a thickness greater than about 0.1 nm, or in the range of from about 0.1 nm to about 1000 nm, including from about 10 nm to about 500 nm, from about 10 nm to about 100 nm, from about 5 nm to about 50 nm, from about 10 nm to about 50 nm, or from about 20 nm to about 30 nm.

In some embodiments, the graphene hard mask film is deposited in a chamber with the substrate pedestal maintained at less than about 700° C., or less than about 600° C., or less than about 500° C., or less than about 400° C., or less than about 300° C., and the pressure maintained at about 5 Torr, with plasma generated at the wafer level (i.e., a direct plasma) by applying a bias of about 200 Watts to the electrostatic chuck. In some embodiments, an additional RF power of about 1000 Watts at 2 MHz is also delivered to the electrostatic chuck, generating a dual-bias plasma at the wafer level.

In general, according to one or more embodiments, the following exemplary deposition process parameters may be used to form the as-deposited film. In one or more embodiments, the wafer temperature may range from about 150° C. to about 700° C., or from about 150° C. to about 500° C. The chamber pressure may range from a chamber pressure in a range of about 0.1 mTorr to about 100 Torr. The flow rate of the precursor-containing gas mixture may be in a range from about 10 sccm to about 1,000 sccm. The flow rate of a dilution gas may individually range from about 50 sccm to about 50,000 sccm.

In one or more embodiments, the graphene hard mask film may be deposited to a thickness in a range of about 5 Å to about 60,000 Å, including a range of about 300 Å to about 10,000 Å, a range of about 2000 Å to about 3000 Å, or a range of about 5 Å to about 200 Å.

According to one or more embodiments, the substrate is subjected to processing prior to and/or after forming the layer. This processing can be performed in the same chamber or in one or more separate processing chambers. In one or more embodiments, the substrate is then moved to another processing chamber for further processing. The substrate can be moved directly from the physical vapor deposition chambers to the separate processing chamber, or it can be moved from the physical vapor deposition chambers to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Figure 3:
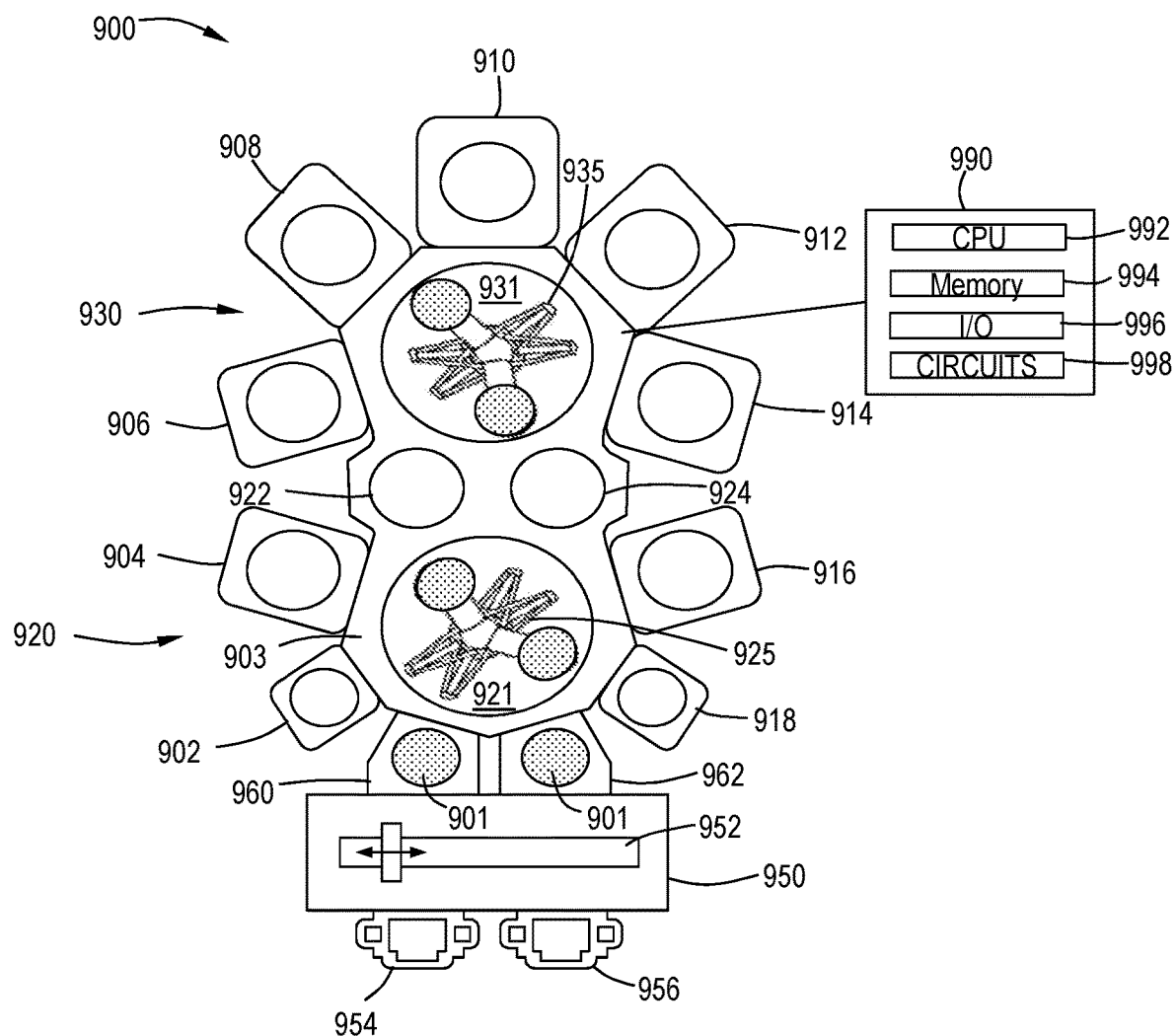
FIG. 3 illustrates a cluster tool according to one or more embodiments.

Additional embodiments of the disclosure are directed to processing tools 900 for the formation of the devices and practice of the methods described, as shown in FIG. 3. The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a physical vapor deposition chamber, a UV curing chamber, an ICP chamber, an etching chamber, and the like. The particular arrangement of process chambers and components can be varied depending on the cluster tool and should not be taken as limiting the scope of the disclosure.

In some embodiments, the cluster tool 900 includes at least one physical vapor deposition chamber. In some embodiments, the cluster tool 900 includes a physical vapor deposition chamber having a remote plasma source connected to the central transfer station.

In the embodiment shown in FIG. 3, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit (CPU) 992, memory 994, inputs/outputs (I/O) 996, and support circuits 998. The controller 990 may control the processing tool 900 directly, or via computers (or controllers) associated with particular process chamber and/or support system components.

In one or more embodiments, the controller 990 may be one of any form of general-purpose computer processor that can be used in an industrial setting for controlling various chambers and sub-processors. The memory 994 or computer readable medium of the controller 990 may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory 994 can retain an instruction set that is operable by the processor (CPU 992) to control parameters and components of the processing tool 900.

The support circuits 998 are coupled to the CPU 992 for supporting the processor in a conventional manner. These circuits include cache, power supplies, clock circuits, input/output circuitry and subsystems, and the like. One or more processes may be stored in the memory 994 as software routine that, when executed or invoked by the processor, causes the processor to control the operation of the processing tool 900 or individual processing units in the manner described herein. The software routine may also be stored and/or executed by a second CPU (not shown) that is remotely located from the hardware being controlled by the CPU 992.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 990 has one or more configurations to execute individual processes or sub-processes to perform the method. The controller 990 can be connected to and configured to operate intermediate components to perform the functions of the methods. For example, the controller 990 can be connected to and configured to control a physical vapor deposition chamber.

Processes may generally be stored in the memory 994 of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the system controller 990 has a configuration to control a physical vapor deposition chamber to deposit a film on a wafer at a temperature in the range of about 20° C. to about 400° C. and control a remote plasma source to form a polysilazane film on the wafer.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a physical vapor deposition chamber and a remote plasma source; a UV curing chamber; an ICP chamber; and a controller connected to the central transfer station and the plurality of process stations, the controller configured to activate the robot to move the wafer between process stations, and to control a process occurring in each of the process stations.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a film, the method comprising:
   exposing a substrate to an aromatic precursor in a processing chamber;
   purging the processing chamber of the aromatic precursor;
   heating the substrate to a temperature less than 600° C. to polymerize the aromatic precursor and deposit a graphene hard mask film on the substrate; and
   purging the processing chamber.

2. The method of claim 1, wherein the aromatic precursor comprises one or more of benzene, substituted benzene, naphthalene, substituted naphthalene, anthracene, and substituted anthracene.

3. The method of claim 1, wherein the aromatic precursor comprises small aromatic molecules with temperature sensitive functional groups.

4. The method of claim 1, wherein the aromatic precursor is selected from one or more of naphthalene, 2,6-dibromonaphthalene, trimethyl 1,3,5-benzentricarboxylate, 9,10-dibromoanthracene, benzoic acid, 2,6-ditertbutylnaphthalene, 1,3,5-trimethoxybenzene, and hexabromobenzene.

5. The method of claim 1, wherein the substrate comprises on one or more of titanium nitride (TiN), tantalum nitride (TaN), silicon (Si), cobalt (Co), titanium (Ti), silicon dioxide ($SiO_2$), copper (Cu), and low-k dielectric materials.

6. The method of claim 1, wherein the substrate is maintained at a temperature in a range of from about 150° C. to about 700° C.

7. The method of claim 6, wherein the substrate is maintained at a temperature in a range of from about 300° C. to about 500° C.

8. The method of claim 1, further comprising repeating the method to provide a graphene hard mask film having a thickness of about 0.3 to about 100 nm.

9. The method of claim 1, further comprising exposing the substrate to a reactant.

10. The method of claim 9, wherein the substrate is exposed to the aromatic precursor and the reactant simultaneously.

11. The method of claim 9, wherein the substrate is exposed to the aromatic precursor and the reactant sequentially.

12. A method of forming a film, the method comprising:
   forming a flowable graphene hard mask film on a substrate by exposing the substrate to an aromatic precursor at a temperature less than 600° C. to polymerize the aromatic precursor in a processing chamber; purging the processing chamber; and
   exposing the substrate to a plasma.

13. The method of claim 12, wherein the aromatic precursor comprises one or more of benzene, substituted benzene, naphthalene, substituted naphthalene, anthracene, and substituted anthracene.

14. The method of claim 12, wherein the aromatic precursor is selected from one or more of naphthalene, 2,6-dibromonaphthalene, trimethyl 1,3,5-benzentricarboxylate, 9,10-dibromoanthracene, benzoic acid, 2,6-ditertbutylnaphthalene, 1,3,5-trimethoxybenzene, and hexabromobenzene.

15. The method of claim 12, wherein the substrate comprises one or more of titanium nitride (TiN), tantalum nitride (TaN), silicon (Si), cobalt (Co), titanium (Ti), silicon dioxide ($SiO_2$), copper (Cu), and low-k dielectric materials.

16. The method of claim 12, wherein the plasma is a remote plasma.

17. The method of claim 12, wherein the plasma comprises one or more of ammonia ($NH_3$), nitrogen ($N_2$), argon (Ar), helium (He), hydrogen ($H_2$), carbon monoxide (CO), or carbon dioxide ($CO_2$).

18. A non-transitory computer readable medium including instructions, that, when executed by a controller of a processing chamber, causes the processing chamber to perform operations of:
   expose a substrate to an aromatic precursor in the processing chamber;
   purge the processing chamber of the aromatic precursor;
   heat the substrate to a temperature less than 600° C. to polymerize the aromatic precursor and deposit a graphene hard mask film on the substrate; and
   purge the processing chamber.

19. The non-transitory computer readable medium of claim 18, wherein the aromatic precursor comprises one or more of benzene, substituted benzene, naphthalene, substituted naphthalene, anthracene, and substituted anthracene.

20. The non-transitory computer readable medium of claim 18, wherein the substrate comprises one or more of titanium nitride (TiN), tantalum nitride (TaN), silicon (Si), cobalt (Co), titanium (Ti), silicon dioxide ($SiO_2$), copper (Cu), and low-k dielectric materials.

* * * * *